(12) United States Patent
Koga et al.

(10) Patent No.: US 7,255,154 B2
(45) Date of Patent: Aug. 14, 2007

(54) COOLING DEVICE

(75) Inventors: Shinya Koga, Omuta (JP); Nobuyuki Goto, Fukuoka (JP); Tetsuya Anami, Onojyo (JP); Toshihiko Matsuda, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 21 days.

(21) Appl. No.: 11/126,323

(22) Filed: May 11, 2005

(65) Prior Publication Data

US 2006/0118278 A1 Jun. 8, 2006

(30) Foreign Application Priority Data

Dec. 5, 2004 (JP) .............................. 2004-142032

(51) Int. Cl.
*F28D 15/00* (2006.01)
*F28F 3/02* (2006.01)
(52) U.S. Cl. .............................. 165/104.33; 165/80.4; 165/121
(58) Field of Classification Search .............. 165/80.4, 165/121, 104.31, 104.33; 361/699, 695, 361/698; 417/423.1, 423.14
See application file for complete search history.

(56) References Cited

U.S. PATENT DOCUMENTS 5,764,483 A 6/1998 Ohashi et al.
6,019,165 A * 2/2000 Batchelder .................. 165/80.3
6,408,937 B1 * 6/2002 Roy ....................... 165/104.33
6,789,610 B1 * 9/2004 Hegde .................... 165/104.21
6,839,234 B2 * 1/2005 Niwatsukino et al. ...... 361/695
2004/0052048 A1 * 3/2004 Wu et al. .................. 361/699
2004/0105232 A1 * 6/2004 Ito et al. .................... 361/687
2004/0240179 A1 * 12/2004 Koga et al. ................. 361/699
2005/0117298 A1 6/2005 Koga et al.
2006/0144568 A1 * 7/2006 Crocker et al. ......... 165/104.33

FOREIGN PATENT DOCUMENTS

JP 775382 11/1989
JP 7142886 6/1995

* cited by examiner

*Primary Examiner*—Tho Duong
(74) *Attorney, Agent, or Firm*—Stevens, Davis, Miller & Mosher, LLP

(57) ABSTRACT

A cooling device includes a heat-radiating device and a centrifugal pump provided in a closed circulation passage for circulating refrigerant. The centrifugal pump contacts and absorbs heat from heat-generating electronic parts by heat exchange of the refrigerant therein to radiate the heat via the heat-radiating device. The centrifugal pump includes a lower casing that comes into contact with the heatgenerating electronic parts, an upper casing disposed to face the lower casing to form a pump chamber, and an impeller sandwiched between the upper casing and the lower casing. The lower casing includes a recessed conical surface facing the impeller, at least one protrusion provided in a center portion of the recessed conical surface and a contact face with which the heat-generating electronic parts come into contact formed directly below the protrusion on an opposite side of the recessed conical surface.

7 Claims, 12 Drawing Sheets

COOLING DEVICE

This application is based on Japanese Patent Application No. 2004-142032, which is incorporated herein by reference.

BACKGROUND OF THE INVENTION

1. Field of the Invention

The present invention relates to a cooling device for electronic parts, which cools heat-generating electronic parts such as a microprocessor (hereinafter referred to as a CPU) installed in a housing by the circulation of refrigerant.

2. Description of the Related Art

In recent years, computer speed increases rapidly, and thus the clock frequency of the CPU becomes extremely large as compared to that of the old days. As a result, the amount of heat generated by the CPU increases considerably, and thus the computer cannot be cooled sufficiently only by the air cooling of a heat sink, and it is indispensable to install a high-efficiency and high-output cooling device. As a result, a cooling device that circulates refrigerant to cool a board on which heat-generating electronic parts are mounted is proposed as the cooling device (see JP-A-7-142886).

Hereinafter, a related cooling device for electronic parts, which circulates refrigerant to cool the electronic parts, will be described. The cooling device shown in FIG. 8 is a related cooling device for electronic parts in the related art (see JP-A-7-142886). The cooling device transfers the heat generated by the heat-generating parts to a metallic housing that is a heat-radiating portion, efficiently so as to cool the heat-generating members. FIG. 8 illustrates the structure of the related cooling device for an electronic apparatus.

In FIG. 8, a reference numeral 108 is a circuit board of an electronic apparatus, a reference numeral 109 is a keyboard, a reference numeral 110 is a semiconductor heating element, a reference numeral 111 is a disc device, a reference numeral 112 is a display device, a reference numeral 113 is a heat-receiving header that exchanges heat with the semiconductor heating element 110, a reference numeral 114 is a heat-radiating header for radiating heat, a reference numeral 115 is a flexible tube, and a reference numeral 116 is the metallic housing of the electronic apparatus.

The cooling device thermally connects the semiconductor heating element 110, which is a heat-generating member, with the metallic housing 116 via a heat transfer device having a flexible structure. The heat transfer device is constituted with the flat heat-receiving header 113 having a liquid passage attached to the semiconductor heating elements 110, the heat-radiating header 114 that is in contact with a wall of the metallic housing 116 having a liquid passage, and the flexible tube 115 that connects the heat-receiving header 113 with the heat-radiating header 114. Also, the heat transfer device drives or circulates liquid that is enclosed in the heat transfer device between the heat-receiving header 113 and the heat-radiating header 114 by using a liquid driving mechanism built in the heat-radiating header 114. As a result, the semiconductor heating elements 110 and the heat-radiating header 114 can be easily connected with each other regardless of the arrangement of the parts, and heat is efficiently transferred by the driving of the liquid. Since the heat-radiating header 114 is thermally connected with the metallic housing 116, and the metallic housing 116 has high thermal conductivity, heat is dissipated widely throughout the metallic housing 116.

In addition, the present applicant proposed a turbo-type pump, as a heat-receiving pump, which can circulate a large amount of refrigerant and comes into contact with the heat-generating members to exchange heat. Also, the applicant proposed a technique in which a pump casing comes into close contact with heat-generating electronic parts to exchange heat (Japanese Patent Application No. 2003-374136).

Further, a design to form a recessed conical surface by a casing of a water pump is registered. However, since the registered design evidently has no relation to a pump for a cooling device, the above registered design cannot be applied to a pump for a cooling device (see Japanese Registered Design Publication No. 775382).

In the cooling device according to JP-A-7-142886, when the thermal conductivity of the heat-receiving header 113 is low, refrigerant cannot exchange heat with the heat-generating members. Also, since the heat exchange basically depends on the material of the refrigerant, heat can be exchanged within a certain extent, and thus the cooling efficiency cannot be further improved. In addition, since the structure of the liquid driving mechanism becomes complex, and the flow rate of the refrigerant becomes small in a reciprocating pump and the like, there is a limitation in making the cooling device smaller and in making the cooling device slimmer.

In addition, in the cooling device proposed by the applicant, it is possible to make the cooling device smaller, and to make the cooling device slimmer, and to cool the heat-generating members at a high-efficiency. However, it is necessary to increase the thermal conduction in the pump casing structurally, and to increase the heat transfer from the pump casing to the refrigerant in order to further improve the cooling efficiency. Particularly, since it is necessary to support an impeller of the pump in the vicinity of the suction port of the turbo-type pump, it is structurally impossible to transfer heat in the vicinity of the suction port, and thus to transfer heat. Also, the shape of the related pump casing has too large thermal resistance for dissipating heat throughout the casing, and also the shape of the pump casing has too large thermal resistance for transferring heat to the flow of the refrigerant.

SUMMARY OF THE INVENTION

An object of the present invention is to provide a high-efficiency cooling device having a centrifugal pump, which has a low thermal resistance and efficiently transfers heat to refrigerant and has a simplified shaft supporting structure.

The present invention provides a cooling device including a heat-radiating device and a centrifugal pump provided in a closed circulation passage for circulating refrigerant, in which the centrifugal pump comes into contact with heat-generating electronic parts to absorb heat from the heat-generating electronic parts by the heat exchange of the refrigerant therein to radiate the heat via the heat-radiating device. The centrifugal pump comprises a lower casing that comes into contact with the heat-generating electronic parts, an upper casing disposed to face the lower casing to form a pump chamber, and an impeller sandwiched between the lower casing and the upper casing. A recessed conical surface provided on the side of the lower casing facing the impeller, and a plurality of protrusions protruding toward the impeller is provided in the center portion of the recessed conical surface.

According to the cooling device of the present invention, the cooling efficiency can be improved by the centrifugal pump in the casing, which has a low thermal resistance and transfers heat to the refrigerant at high efficiently and can simplify the shaft supporting structure.

DETAILED DESCRIPTION OF THE PREFERRED EMBODIMENTS

Figure 1:
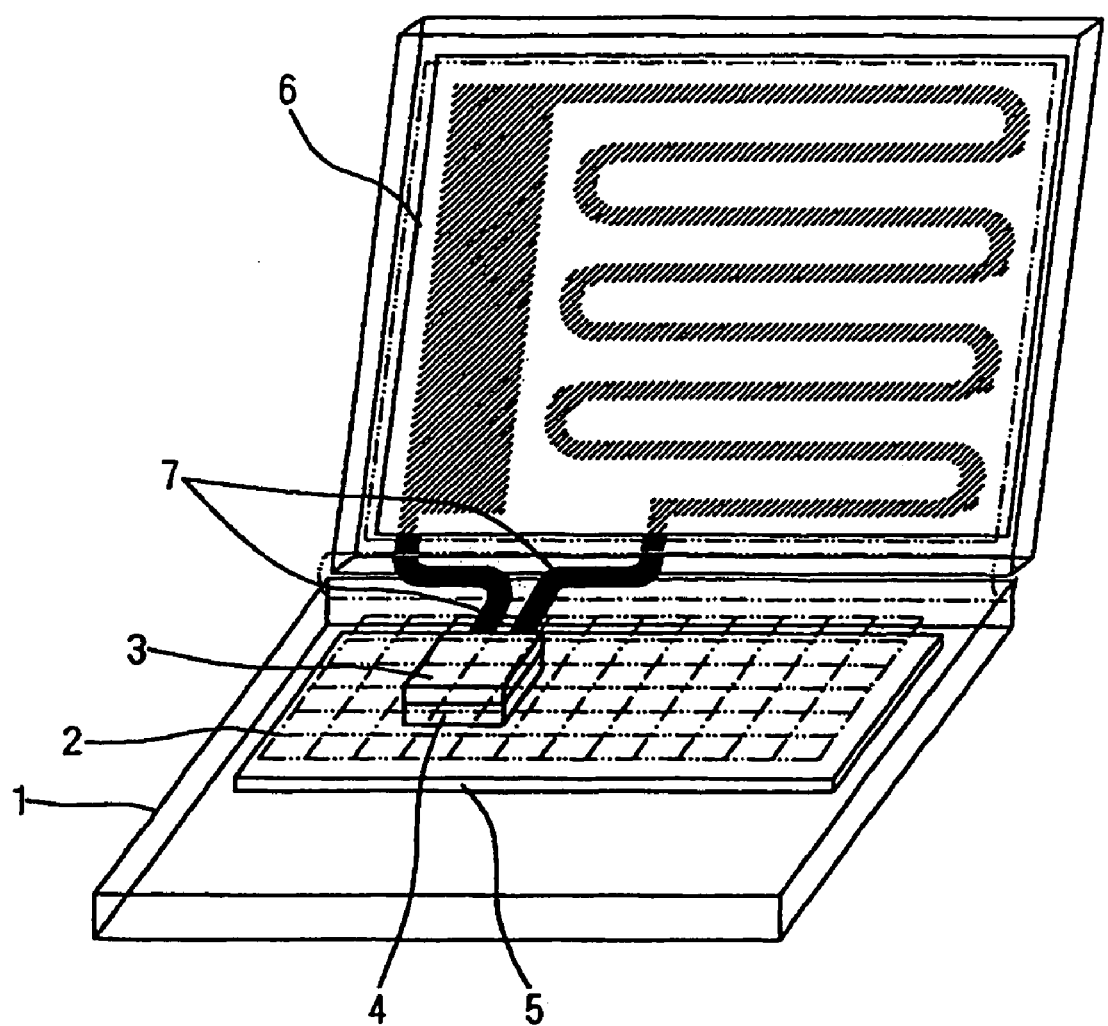
FIG. 1 is a perspective view of an electronic apparatus in which a cooling device according to a first embodiment of the present invention is provided.

A first aspect of the present invention is a cooling device including a heat-radiating device and a centrifugal pump provided in a closed circulation passage for circulating refrigerant, in which the centrifugal pump comes into contact with heat-generating electronic parts to absorb heat from the heat-generating electronic parts by the heat exchange of the refrigerant therein to radiate the heat via the heat-radiating device. The centrifugal pump comprises a lower casing that comes into contact with the heat-generating electronic parts, an upper casing that is disposed to face the lower casing to form a pump chamber, and an impeller that is sandwiched between the lower casing and the upper casing. A recessed conical surface is provided on the side of the lower casing facing the impeller, and a plurality of protrusions protruding toward the impeller is provided in the center portion of the recessed conical surface. Since the center portion of the recessed conical surface is close to the heat-generating electronic parts, the center portion of the recessed conical surface is a small thermal resistance to easily absorb heat, and the recessed conical surface faces the impeller and has an inclined surface that increases in thickness radially outward, heat can be easily transferred to the outside.

A second aspect of the present invention is a cooling device according to the first aspect, in which the recessed conical surface of the lower casing is formed with a radially stepped portion, and the heat-radiating protrusions are provided to protrude from stepped surfaces of the stepped portion. Since the center portion of the recessed conical surface is close to the heat-generating electronic parts, the center portion of the recessed conical surface has a small thermal resistance to easily absorb heat, and the recessed conical surface is an inclined surface having a stepped portion, the flow of the refrigerant is made turbulent easily, and the heat is transferred easily.

A third aspect of the present invention is a cooling device according to the first or second aspect, in which at least one of the heat-radiating protrusions support a bearing of the impeller. The heat-radiating protrusions support the bearing of the impeller in a thrust direction, and increase the contacting area so as to transfer more heat.

A fourth aspect of the present invention is a cooling device according to any one of the first to third aspects, in which the outermost heat-radiating protrusions face leading edges of blades of the impeller with a gap therebetween. Since the heat-radiating protrusions adjoin the leading edges of the blades of the impeller in the horizontal direction, the refrigerant can flow among the protrusions and absorb heat.

A fifth aspect of the present invention is a cooling device according to any one of the first, third and fourth aspects, in which the recessed conical surface of the center portion from which the heat-radiating protrusions protrude, and the portion of the recessed conical surface around the center portion form a conical surface having substantially the same slope angle. Since the surfaces of the casings are smoothly connected to each other, the pump performance and the heat conduction to the outer circumference of the casing from the heat-generating electronic parts are improved.

A sixth aspect of the present invention is a cooling device according to any one of the first to fifth aspects, in which the height of the heat-radiating protrusions decreases radially outward. Since the area of water flow in the pump chamber increases radially outward, the height of the lower casing is required to be low so that the area of water flow inside the circumference of the recessed conical surface is the same as that outside the circumference of the recessed conical surface. Accordingly, since the height of the heat-radiating protrusions is also low, flow velocity and thermal conductivity do not decrease.

A seventh aspect of the present invention is a cooling device including a heat-radiating device and a pump provided in a closed circulation passage for circulating refrigerant, in which the pump comes into contact with the heat-generating electronic parts to absorb heat from the heat-generating electronic parts by the heat exchange of the refrigerant to radiate the heat via the heat-radiating device. The cooling device comprises a pump chamber formed in the casing of the pump, an impeller provided in the pump chamber, and an inclined surface formed in the inner surface of the pump chamber in which the pump chamber faces the impeller. Since the center portion of the inclined surface is close to the heat-generating electronic parts, and the center portion of the inclined surface has a small thermal resistance to easily absorb heat, and the inclined surface faces the impeller and is an inclined surface that increases in thickness radially outward, heat is easily transferred to the outside.

An eighth aspect of the present invention is a cooling device according to the seventh aspect, in which a plurality of protrusions protruding toward the impeller is provided on the inclined surface. Since the center portion of the inclined surface is close to the heat-generating electronic parts, the center portion of the inclined surface has a small thermal resistance to easily absorb heat, and the plurality of protrusions promotes the turbulence of the flow of the refrigerant, heat is easily transferred.

A ninth aspect of the present invention is a cooling device according to the seventh aspect, in which the inclined surface is formed with a radially stepped portion, and the protrusions are provided to protrude from stepped surfaces of the stepped portion. Since the center portion of the inclined surface is close to the heat-generating electronic parts, the center portion of the inclined surface has a small thermal resistance to easily absorb heat, and the recessed conical surface is an inclined surface having the stepped portion provided with the protrusions, the turbulence of the flow of the refrigerant is promoted and heat is easily transferred.

First Embodiment

Figure 2:
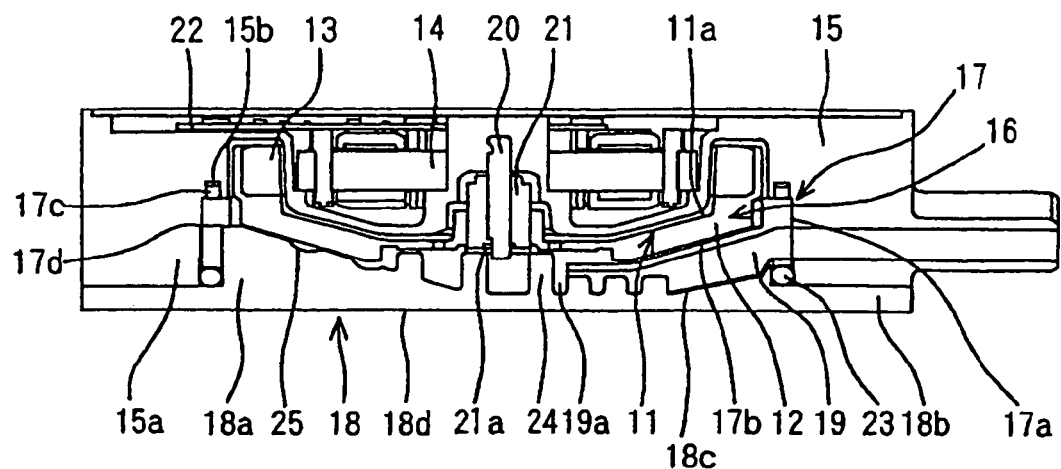
FIG. 2 is a cross-sectional view of a centrifugal pump of the cooling device according to the first embodiment of the present invention.
Figure 3:
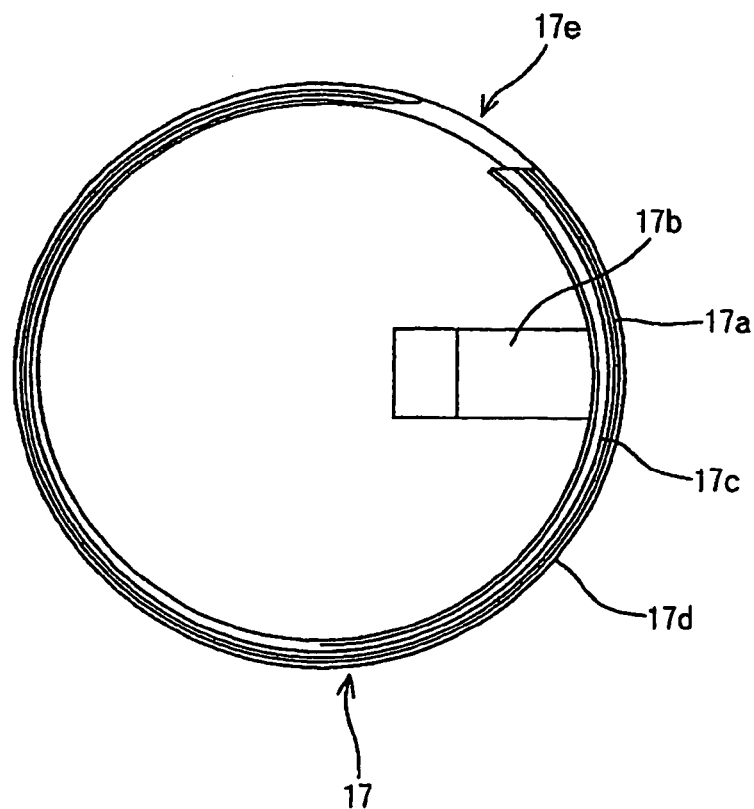
FIG. 3 is a front view of a ring-shaped sealing member of the centrifugal pump according to the first embodiment of the present invention.
Figure 4:
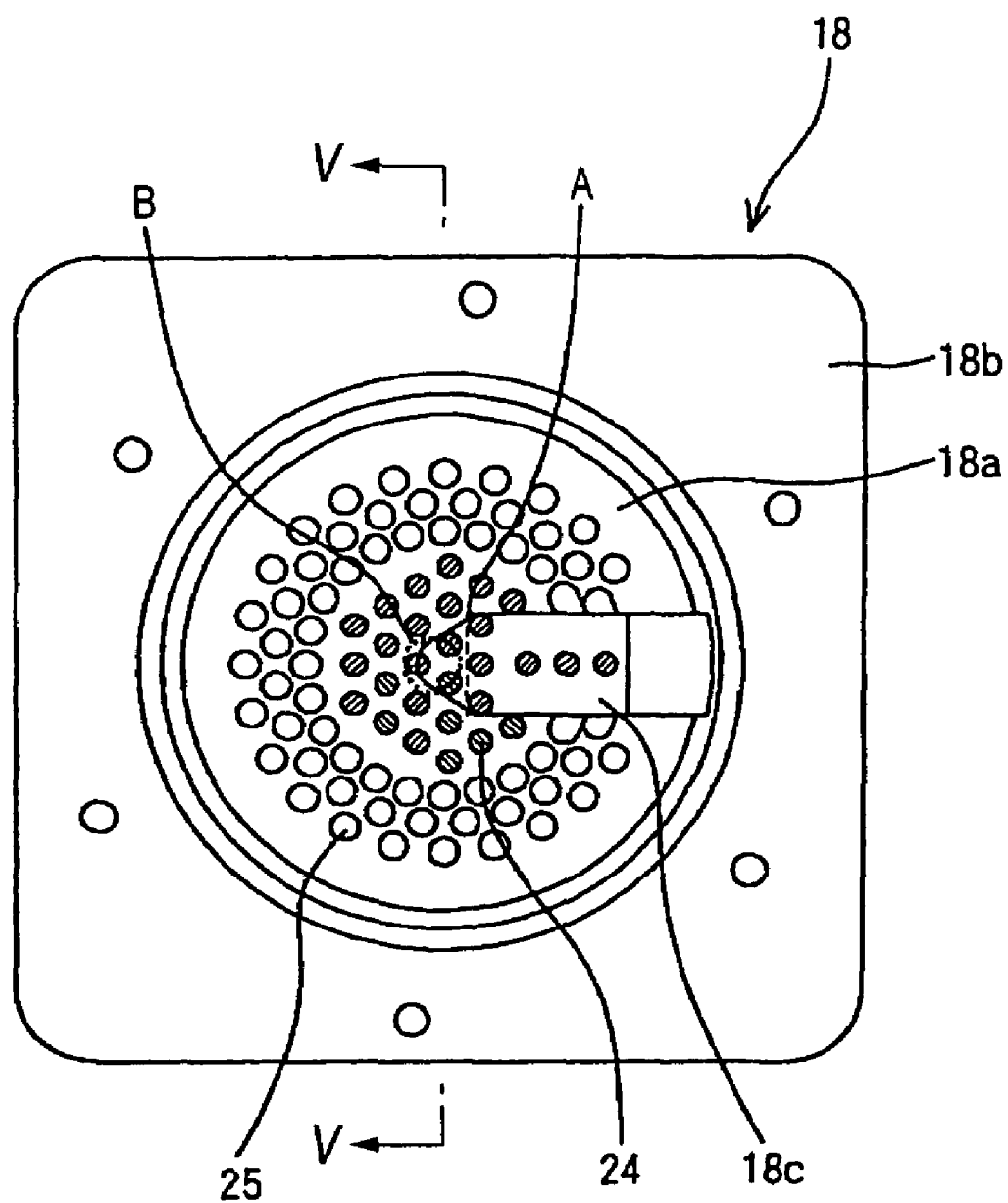
FIG. 4 is a front view of a lower casing of the centrifugal pump according to the first embodiment of the present invention.
Figure 5:
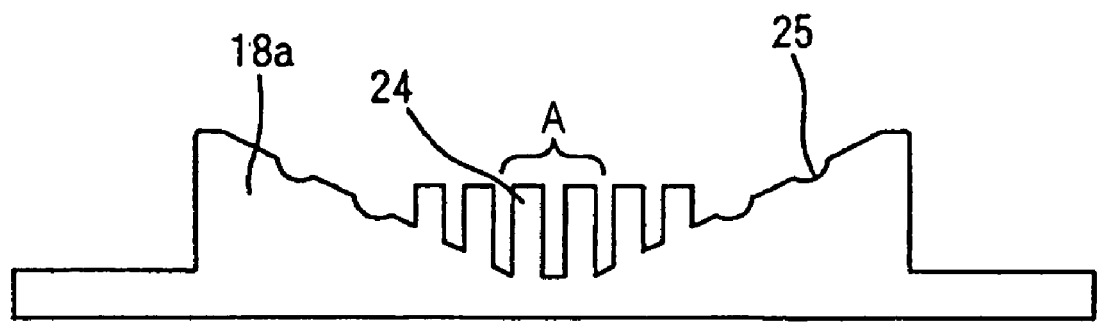
FIG. 5 is a cross-sectional view of the lower casing taken along the line V-V in FIG. 4.
Figure 9A:
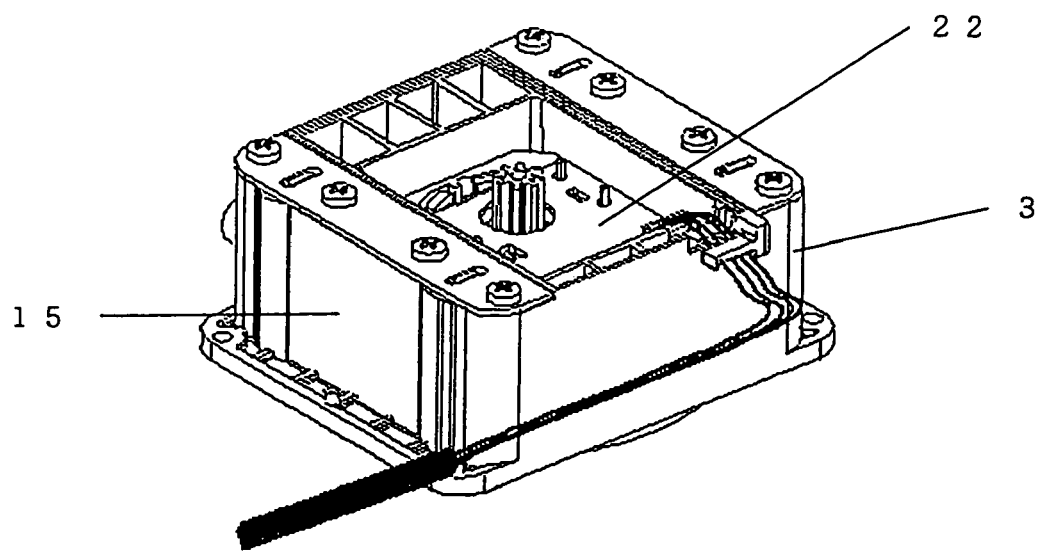
FIGS. 9A and 9B are perspective views illustrating the outer shape of the centrifugal pump according to the first embodiment of the present invention.
Figure 9B:
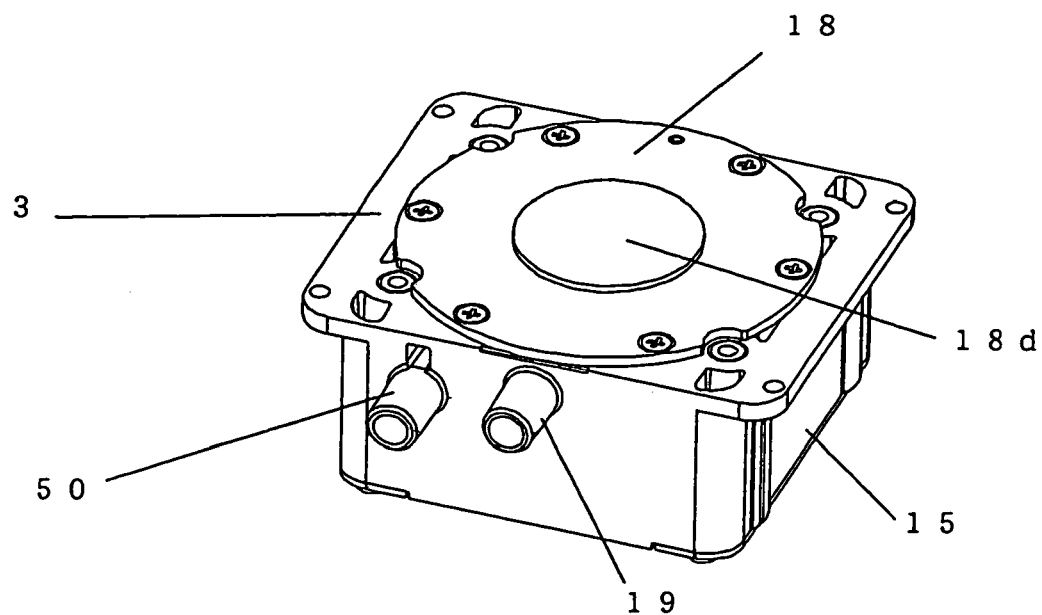
Figure 11:
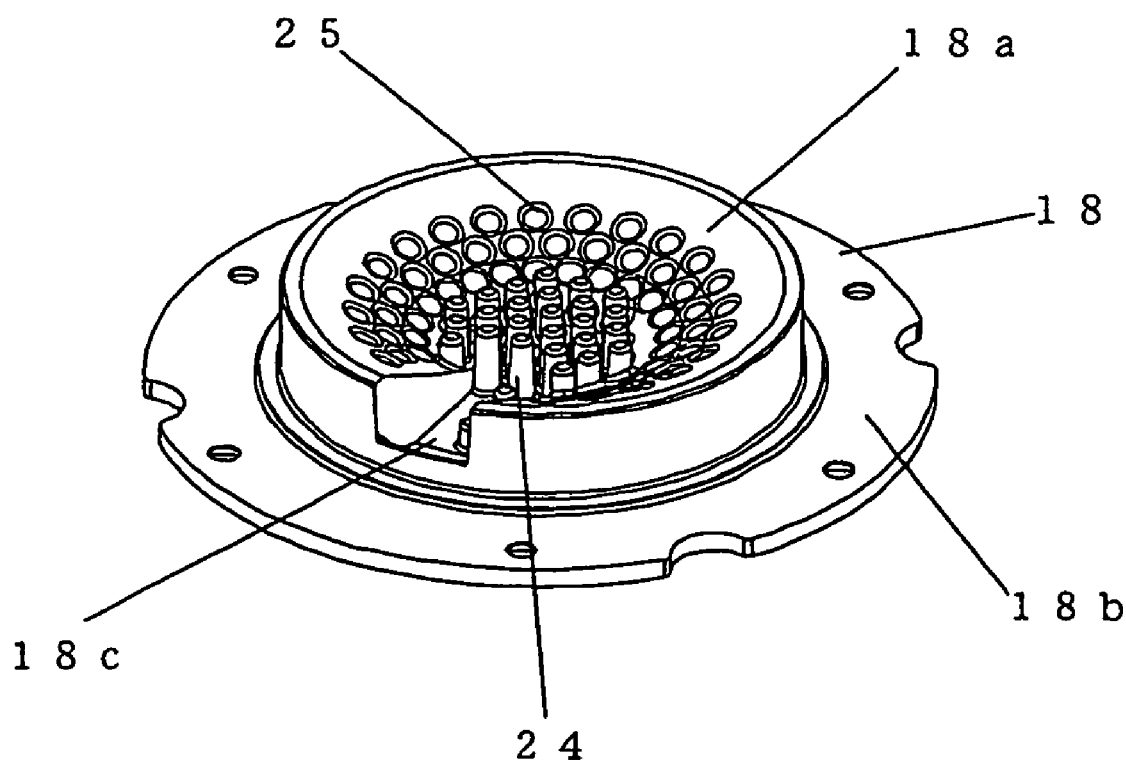
FIG. 11 is a perspective view of the lower casing of the centrifugal pump according to the first embodiment of the present invention.
Figure 12:
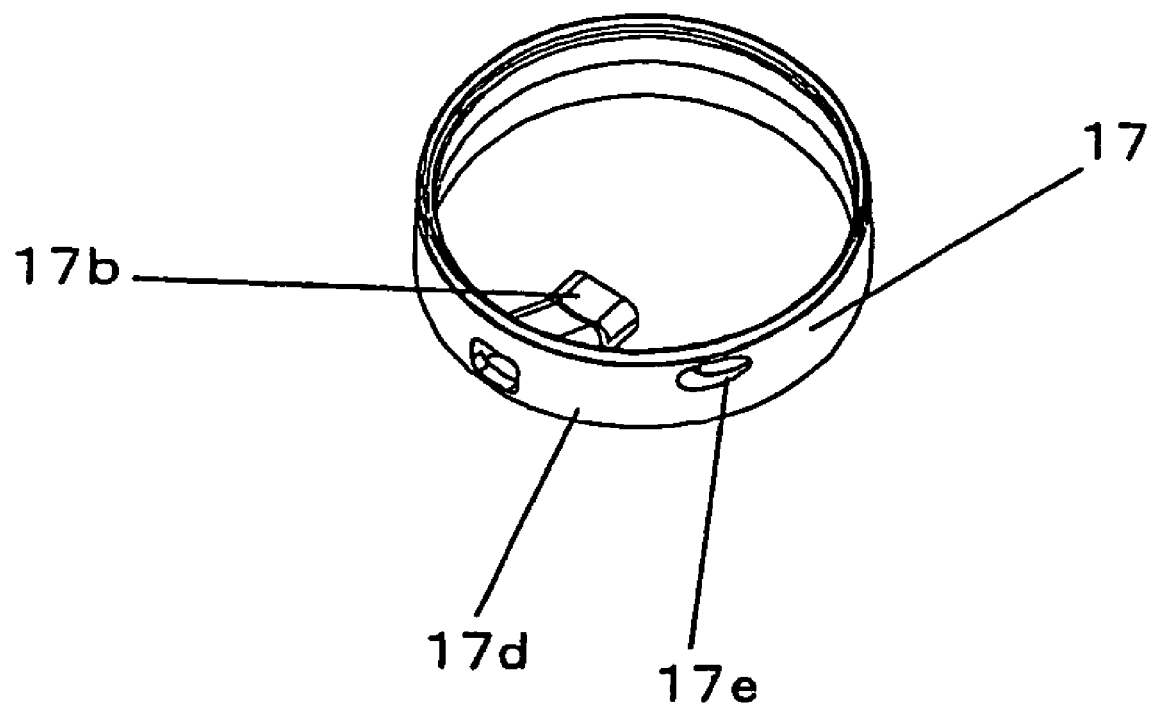
FIG. 12 is a perspective view of the ring-shaped sealing member of the centrifugal pump according to the first embodiment of the present invention.
Figure 13A:
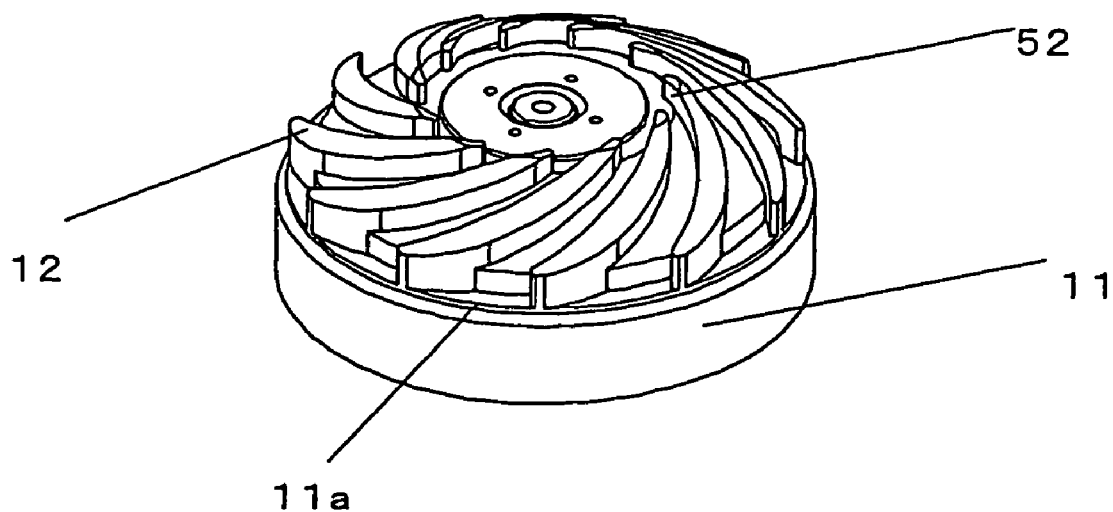
FIGS. 13A and 13B are perspective views of an impeller of the centrifugal pump according to the first embodiment of the present invention.
Figure 13B:
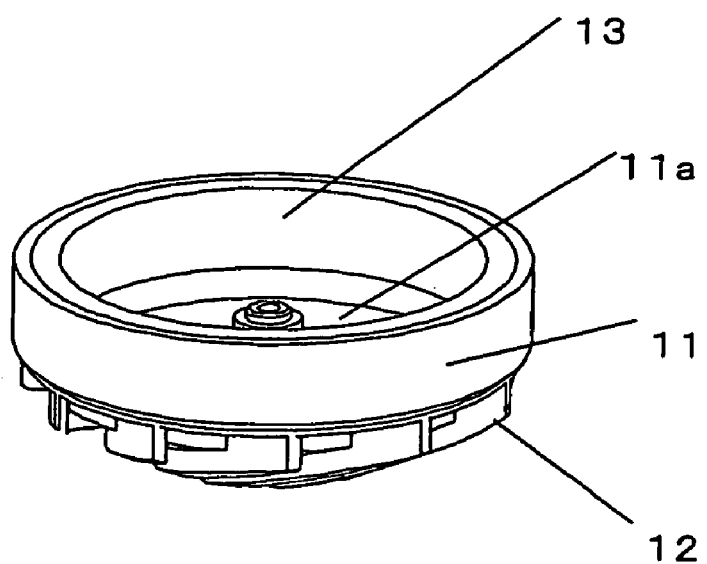

A centrifugal pump of a cooling device according to a first embodiment of the present invention will be described. The centrifugal pump of the first embodiment has a recessed conical surface formed in a heat-receiving casing. FIG. 1 is a perspective view of an electronic apparatus in which the cooling device of the first embodiment according to the present invention is provided, FIG. 2 is a cross-sectional view of the centrifugal pump of the cooling device according to the first embodiment of the present invention, FIG. 3 is a front view of a ring-shaped sealing member of the centrifugal pump according to the first embodiment of the present invention, FIG. 4 is a front view of a lower casing of the centrifugal pump according to the first embodiment of the present invention, FIG. 5 is a cross-sectional view of the lower casing taken along the line V-V in FIG. 4, FIGS. 9A and 9B are perspective views illustrating the outer shape of the centrifugal pump according to the first embodiment of the present invention, FIG. 11 is a perspective view of the lower casing of the centrifugal pump according to the first Embodiment of the present invention, FIG. 12 is a perspective view of the ring-shaped sealing member of the centrifugal pump according to the first embodiment of the present invention, and FIGS. 13A and 13B are perspective views of an impeller of the centrifugal pump according to the first embodiment of the present invention.

In FIG. 1, a reference numeral 1 is a housing of a notebook computer as an electronic apparatus on which the cooling device is mounted, a reference numeral 2 is a keyboard of the notebook computer, a reference numeral 3 is a centrifugal pump that comes into contact with heat-generating elements and exchanges heat with the heat-generating elements to constitute the cooling device (hereinafter referred to as a contact and heat-exchange type centrifugal pump), and a reference numeral 4 is heat-generating electronic parts such as a CPU that is usually a chip having a flat surface. A reference numeral 5 is a board on which the heat-generating parts 4 are mounted, a reference numeral 6 is a heat radiator that radiates to the outside the heat of refrigerant which is received from the heat-generating electronic parts 4 provided at a rear surface of a display of the notebook computer, and a reference numeral 7 is a closed circulation passage that connects the centrifugal pump 3 with the heat radiator 4 and circulates the refrigerant. Meanwhile, it is preferable to use an aqueous solution of propylene glycol as the refrigerant, and it is also preferable to add an anti-corrosion additive since the casing is made of copper or the like as described later.

The heat radiator 6 is made of a material that has a high thermal conductivity and an excellent heat-radiating property, for example, a thin plate material such as copper or aluminum. The heat radiator 6 has a refrigerant passage and a reserve tank formed therein. Also, a fan may be provided to enhance a cooling effect that forces air to strike the heat radiator 6 so as to cool the heat radiator 6. The circulation passage 7 includes a tube made of rubber that is flexible and has a low gas permeability, for example, butyl rubber or the like in order to ensure the degree of freedom of piping layout.

Next, the internal structure of the contact and heat-exchange type centrifugal pump 3 will be described with reference to FIGS. 2 to 5, 9, 11 to 13. In FIG. 2, a reference numeral 11 is an open-type impeller of the centrifugal pump 3, a reference numeral 11a is a main plate of the impeller 11, a reference numeral 12 is an is open-type blades of the impeller 11, and a reference numeral 13 is a magnet rotor provided along the outer circumference of the impeller 11. Although the impeller 11 may be provided separately from the magnet rotor 13, it is preferable to attract the impeller 11 to a portion corresponding to the magnet rotor 13 to form an integral impeller 11. The blades 12 of the impeller 11 have a protruding shape, and the protruding shape of the blades 12 of the impeller 11 has a complementary relation to the recessed shape of a lower casing 11, which will be described later. The pump of the first embodiment has the following specification. The pump is 3 to 50 mm in thickness, and 10 to 100 mm in radial typical dimension. The revolution speed of the pump is 1000 to 8000 rpm, the head of the pump is 0.5 to 10 m, and the specific speed of the pump is about 12 to 250 (unit: m, $m^3$/minute, rpm).

A reference numeral 14 is a stator provided at the inner circumferential side of the magnet rotor 13, a reference numeral 15 is an upper casing for accommodating the impeller 11 and for converting kinetic energy, which is applied to fluid by the impeller 11, into pressure and leading it to a discharge port, a reference numeral 15a is a ring-shaped fitting portion formed at the outer circumference of the upper casing 15, and a reference numeral 16 is a pump chamber for converting kinetic energy, which is applied by the open-type blades 12, into pressure and leading it to the discharge passage. Also, a reference numeral 17 is a ring-shaped sealing member that fits with the upper casing 15 to form the pump chamber 16, and a reference numeral 18 is a lower casing, that is, a heat-receiving casing, which fits with the ring-shaped sealing member 17 and comes into contact with the heat-generating electronic parts 4, a reference numeral 19 is a suction passage, and a reference numeral 19a is a suction port. Each of the upper casing 15 and the ring-shaped sealing member 17 is integrally molded of resin such as polyphenylene sulfide (PPS) or polyphenylene ether (PPE), and the upper casing 15 is fitted with the ring-shaped sealing member 17.

Meanwhile, as shown in FIGS. 2 and 3, the ring-shaped sealing member 17 of the first embodiment has the following structure. A reference numeral 17a is a shoulder that receives a conical thick portion 18a of the lower casing 18 and abuts and positions the top and side surfaces of the conical thick portion 18a, and a reference numeral 17b is a water passage sealing member that is provided between the upper casing 15 and the lower casing 18 to cover a groove 18c, which will be described later, to separate the pump chamber 16 and the suction passage 19 from each other. Also, a reference numeral 17c is a holding portion that protrudes in a ring-shape and fits with the upper casing 15, and a reference numeral 17d is a ring-shaped fitting portion that fits with the side surface of the conical thick portion 18a, and a reference numeral 17e is a communicating port that communicates the pump chamber 18, which is formed above the ring-shaped sealing member 17, with the discharge port 50. The discharge port 50 extends parallel to the suction passage 19 as shown in FIGS. 2 and 9 radially from the pump chamber 16. In the first embodiment, although the discharge port 50 extends radially parallel to the suction passage 19 in order to make the whole arrangement of the cooling device compact and to prevent the degradation of pump characteristics, the present invention is not limited thereto. Also, the heights of the suction passage 19 and the discharge passage 50 from a contacting surface 18d that comes into contact with the heat-generating electronic parts 4 are different from each other. However, the present invention is not limited thereto.

Similarly, as shown in FIGS. 2 to 4, the lower casing 18 of the first embodiment is made of a metallic material, which has a high thermal conductivity and an excellent heat-radiating property, for example, copper, aluminum and the like, and has the following structure. A reference numeral 18a is a conical thick portion in which a recessed conical surface is formed. The recessed conical surface forms the side surface of the pump chamber 16. A reference numeral 18b is a collar that is formed around the conical thick portion 18a. The outer shape of the collar 18b may be rectangular or circular, not limited thereto. A reference numeral 18c is a groove that is formed in the conical thick portion 18a, and a reference numeral 18d is a contacting surface that comes into contact with the heat-generating electronic parts 4. As can be seen from FIGS. 2 and 4, the groove 18c is a portion whose tapered portion is opened from the water passage sealing member 17b at a location represented by a dotted line A (see FIG. 4). The contacting surface 18d of the bottom surface of the lower casing 18 has a complementary surface, which can reliably come into contact with the surfaces of the heat-generating electronic parts 4, in order to come into contact with the heat-generating electronic parts 4 and exchange heat with the heat-generating electronic parts 4. Usually, the shapes of the contacting surface 18d and the surfaces of the heat-generating electronic parts 4 are flat.

The ring-shaped sealing member 17 is disposed between the upper casing 15 and the lower casing 18, and fits with the upper casing 15 and the lower casing 18. The upper portion of the groove 18c is covered with the water passage sealing member 17b to form the suction passage 19. In this case, the pump chamber 16 is also formed simultaneously. In addition, the fitting portion 15a fits with the side surface of the shoulder 17a of the ring-shaped sealing member 17, and comes into contact with the top surface of the collar 18b of the lower casing 18 to close the casing tightly, so that the respective casings are combined with each other to form the pump chamber 16.

Meanwhile, the first embodiment employs the casings made of the combination of resin and metal. This is because, when the casings are made of metal only, the rotation of the magnet rotor 13 causes an eddy current and thus the efficiency of the motor is degraded. That is, the stator 14 generates a rotating magnetic filed, and the rotating magnetic filed rotates the magnet rotor 13. The magnetic flux of the magnet rotor 13 varies with time in the pump casing, and the eddy current flows in such a direction that hinders the variation of the magnetic flux, thereby causing the eddy current loss. Particularly, if the casings are made smaller and slimmer by using copper, the efficiency of the motor is degraded considerably. However, in the first embodiment, the upper casing 15 and the ring-shaped sealing member 17 are made of resin, so that the efficiency of the motor can be prevented from degrading, and also the decrease of the heat-radiating amount and the heat-radiating efficiency caused by the degradation of the motor efficiency can be prevented.

However, since the upper casing 15 and the ring-shaped sealing member 17 are made of resin, and the lower casing 18 is made of metal, the difference in thermal expansion between the upper and lowered casings is induced when they exchange heat. Generally, since metal has a higher coefficient of thermal expansion than resin, the casing cannot be sealed tightly when the fitting portion 17d is not provided. However, in the first embodiment, since the fitting portion 17d is provided at the side of the conical thick portion 18a, if the temperature rises, the fitting portion 15a receives a force from the conical thick portion 18a to tightly close the casing, and thus the refrigerant does not leak while no excessive force exerts on screws, etc. directly. In addition, since the fitting portion 17d receives thermal expansion almost uniformly in the height direction on a cylindrical inner surface, the screws are loosened, and an air gap is formed between the contacting surface 18d and the heat-generating electronic parts 4. Therefore, the area of heat transfer does not decrease, and the heat transfer between the heat-generating electronic parts 4 and the centrifugal pump 3 is not hindered.

Also, since the ring-shaped sealing member 17 is disposed between the upper casing 1S and the lower casing 18, a portion of the suction passage 19 in the pump chamber 16, which is difficult to be worked, can be constituted with the groove 18c and the separate ring-shaped sealing member 17, and thus the lower casing 18 may be provided with the groove 18c. Therefore, it is easy to process the suction passage 19. In other words, since the ring-shaped sealing member 17, which has a complex shape, is integrally formed of a resin material, and the upper casing 15 is formed of a resin material to fit with the ring-shaped sealing member 17, it becomes extremely easy to process and assemble the ring-shaped sealing member 17 and the upper casing 15. Also, the suction port 19a can be easily provided in the center portion of the pump chamber 16, and the refrigerant can be led to the center portion of the pump chamber 16. It is preferable that the casing consist of three pieces in consideration of the assembling and the heat transfer as in the first embodiment. However, if required, each of the upper casing 15 and/or the lower casing 18, and the ring-shaped sealing member 17 may be constituted with a plurality of pieces. In this case, the degree of freedom of design can be increased.

Hereinafter, the shaft supporting structure of the impeller 11 will be described with reference to FIG. 2. In FIG. 2, a reference numeral 20 is a fixed shaft that is provided at the upper casing 15 and rotatably supports the impeller 11. The fixed shaft is integrally fixed to the upper casing 15 with resin. In addition, a reference numeral 21 is a bearing that is mounted on the fixed shaft 20 provided at the center of the impeller 11, and a reference numeral 21a is a receiving plate made of stainless, etc., that attaches the bearing 21 to the fixed shaft 20. The receiving plate 21a receives an axial thrust force during the rotation of the impeller 11 to prevent the wear of pins 24, which will be described later. A reference numeral 22 is a control board on which the motor unit with the magnet rotor 13 and the stator 14 rotates the magnet rotor of an outer rotor. A reference numeral 23 is a sealing member such as an O-ring for sealing the space among the upper casing 15, the lower casing 18 and the ring-shaped sealing member 17.

Subsequently, the lower casing 18 according to the first embodiment of the present invention will be described with reference to FIGS. 2 to 5 and 11. A reference numeral 24 represents a plurality of pins (heat-radiating protrusions of the present invention) that protrudes from the recessed conical surface of the conical thick portion 18a, and a reference numeral 25 represents a plurality of dimples with hollows provided around the pins in the recessed conical surface of the conical thick portion 18a. The plurality of pins 24 is provided around the center of the conical thick portion 18a and in the groove 18c, and is formed to extend to the vicinity of the blades 12 of the impeller 11. The height of the pins 24 decreases radially outward. Therefore, the shape of the pump chamber 16 does not decrease the flow velocity of the refrigerant, and thus the flow rate and the thermal conductivity do not decrease.

A dotted line A in FIG. 4 represents an area in which the water passage sealing member 17b covers the groove 18c. Therefore, a tapered portion before the dotted line A is opened to the suction port 19a in the center of the pump chamber 16, and communicates the suction passage 19, which is constituted with the groove 18c and the water passage sealing member 17b, with the pump chamber 16. The reason why the above portion is tapered is that the inflow direction becomes parallel to the contacting surface 18d. The pins 24 and the dimples 25 increase the surface area of the conical thick portion 18a, and make a boundary layer turbulent, thereby allowing the turbulent boundary layer to have a high thermal conductivity. In addition, it is necessary to provide the dimples 25 at the outer circumference of the impeller 11 in order to prevent the leakage via a gap between the blades 12 and the conical thick portion 18a.

Meanwhile, in the impeller 11 of the related centrifugal pump 3, it is necessary to provide a bearing supporting structure in the center portion since an axial thrust force exerts. However, the bearing supporting structure degrades the heat transfer in the vicinity of the suction port 19a. In the first embodiment of the present invention, the pins 24, which extend as high as the receiving plate 21, are provided in the area represented by a dotted line B in FIG. 4, and the pins 24 support the lower end of the receiving plate 21a at a plurality of positions with the upper ends thereof. Thus, it is possible to eliminate the related bearing supporting structure, and it is also possible to receive the axial thrust force as well as to transfer heat. The plurality of the pins 24 (three pins in the first embodiment) is arranged in the area represented by the dotted line B, at locations radially equidistant from the center of the shaft the impeller 11. The pins 24 also make turbulent the flow of refrigerant that flows into the suction port 19a, and can transfer heat at high efficiency by virtue of the considerably increased surface area.

Figure 10:
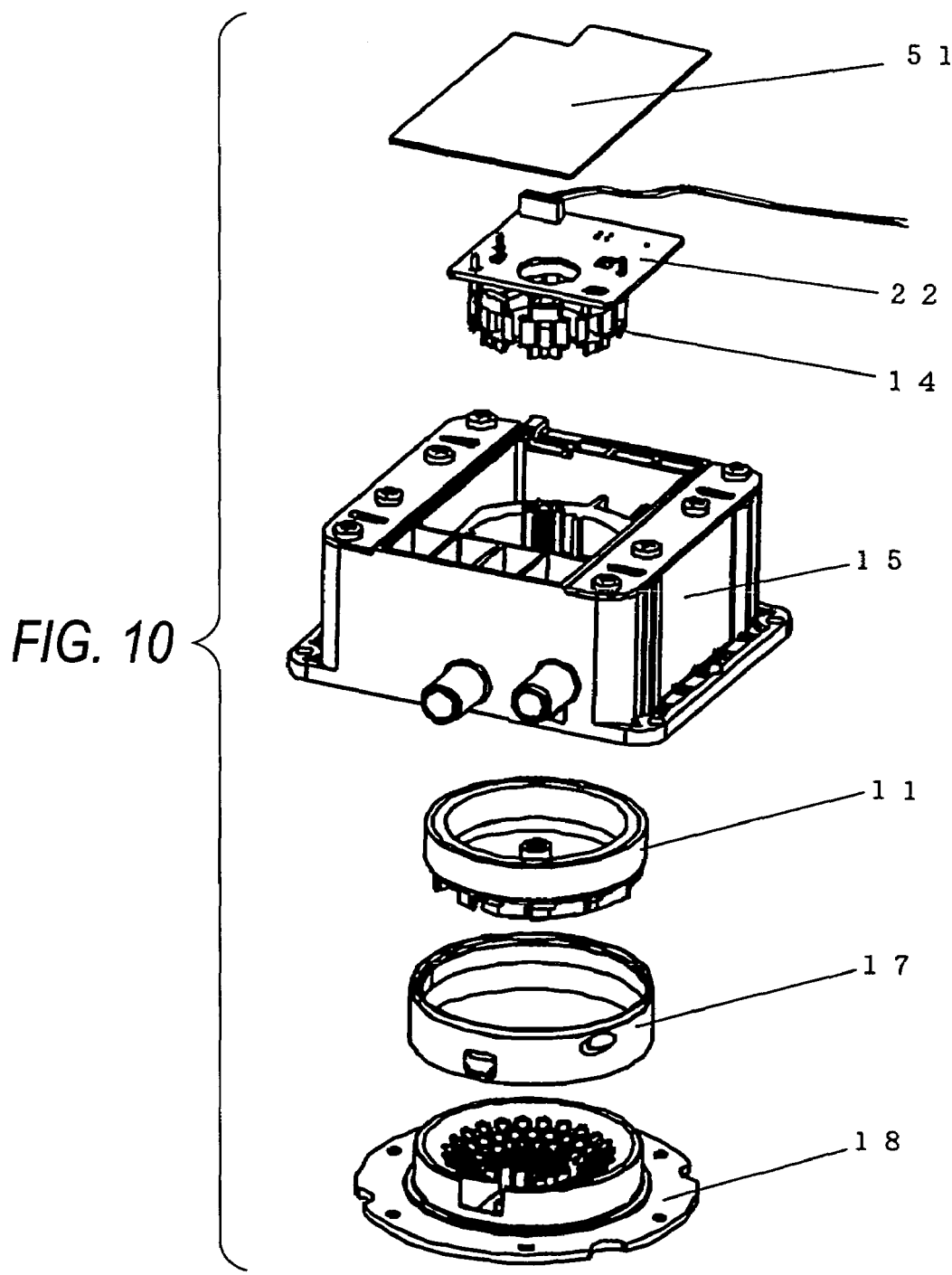
FIG. 10 is an exploded perspective view of the centrifugal pump according to the first embodiment of the present invention.

FIG. 10 is an exploded perspective view of the centrifugal pump according to the first embodiment of the present invention. In assembling the centrifugal pump 3 described above, first, the bearing 21 is rotatably fitted with the fixed shaft 20 integrally formed with the upper casing 15, and the impeller 11 is then inserted into the upper casing 15. Next, the water passage sealing member 17b of the ring-shaped sealing member 17 is fitted with the lower casing 18, and the receiving plate 21 is sandwiched between the bearing 21 and the lower casing 18. Also, the space between the upper casing 15 and the lower casing 18 is sealed with the sealing member 23, and the ring-shaped sealing member 17 and the lower casing 18 are fitted with the upper casing 15. Thereafter, the stator 14 is press-fitted into the hollows of the upper casing 15 formed in the rear surface of the impeller 11. In addition, the control board 22 is provided on the stator 14 to control the electric current that flows into the stator 14. Then, the control board 22 of the upper casing 15 is covered with a cover 51.

Hereinafter, the operation of the centrifugal pump of the cooling device according to the first embodiment will be described. The refrigerant flows through the suction passage 19, and flows into the center portion of the pump chamber 16 via the tapered portion of the groove 18c. Although it is difficult for the refrigerant to flow centripetally, since the conical thick portion 18a is recessed toward the center portion at a certain slope angle or an angle along the outer shape of the impeller 11, and the space of the suction port 19a is large, the refrigerant can flow into the center portion against relatively small resistance. In the present embodiment, the vertical angle is 125 degrees. In this case, the refrigerant increases the flow velocity thereof at the tapered portion, and is made turbulent by the pins 24. Also, since the center portion of the lower casing 18 has a small thickness and a small thermal resistance, the heat from the heat-generating electronic parts 4 is easily transferred, and the pins 24 are concentrated in the center portion of the lower casing 18, the area of heat transfer is large, and the center portion of the lower casing 18 becomes a turbulent boundary layer. Therefore, the synergy effect makes the center portion receive the heat at high efficiency.

Since the recessed conical surface of the lower casing 18 elevates in a straight-line along the outer shape of the blades 12 of the impeller 11 as the recessed conical surface goes radially outward, heat does not take a long way when the heat is transferred. Also, since inflow edges (leading edges) 52 of the blades are disposed at regular intervals of 0.5 to 2 mm outside the outermost pins 24, and the impeller 11 rotates to overlap the height direction of the pins 24, the refrigerant that has passed through the gaps between the pins 24 flows into the blades 12 of the impeller 11 directly, the fluid resistance is small and the efficiency of the pump improves.

In addition, the recessed conical surface of the conical thick portion 18a has an angle (gradient) that is inclined to have a complementary shape to the shape of the blades 12 of the impeller 11 in order to increase the pressure of the refrigerant that flows into the recessed conical surface by the pumping operation in the center portion from which the heat-radiating protrusions 24 protrude, and in the portion around the center portion, and in order to lead the refrigerant to the communicating port 17e that extends to the discharge passage 50 of the centrifugal pump 3, and forms a continuous conical surface along the outer shape of the impeller 11. Therefore, the efficiency of the pump can be improved. That is, since it is easy for the refrigerant, which has passed through the gaps among the pins 24, to flow to the blades 12, the refrigerant can flow as far as the bases of the highest-temperature pins 24, and the heat transferred to the lower casing 18 can be transferred to the refrigerant in a large amount.

Meanwhile, in the first embodiment, the recessed portion of the conical thick portion 18a forms a conical surface. However, the recessed portion may form a spherical surface.

In addition, in the first embodiment, the cooling device is applied to a notebook computer. However, the present invention is not limited thereto, and the cooling device can be applied to any electronic apparatus that uses heat-generating electronic parts such as a desktop computer, a projector or a display device, and that requires the cooling thereof.

Second Embodiment

Figure 6:
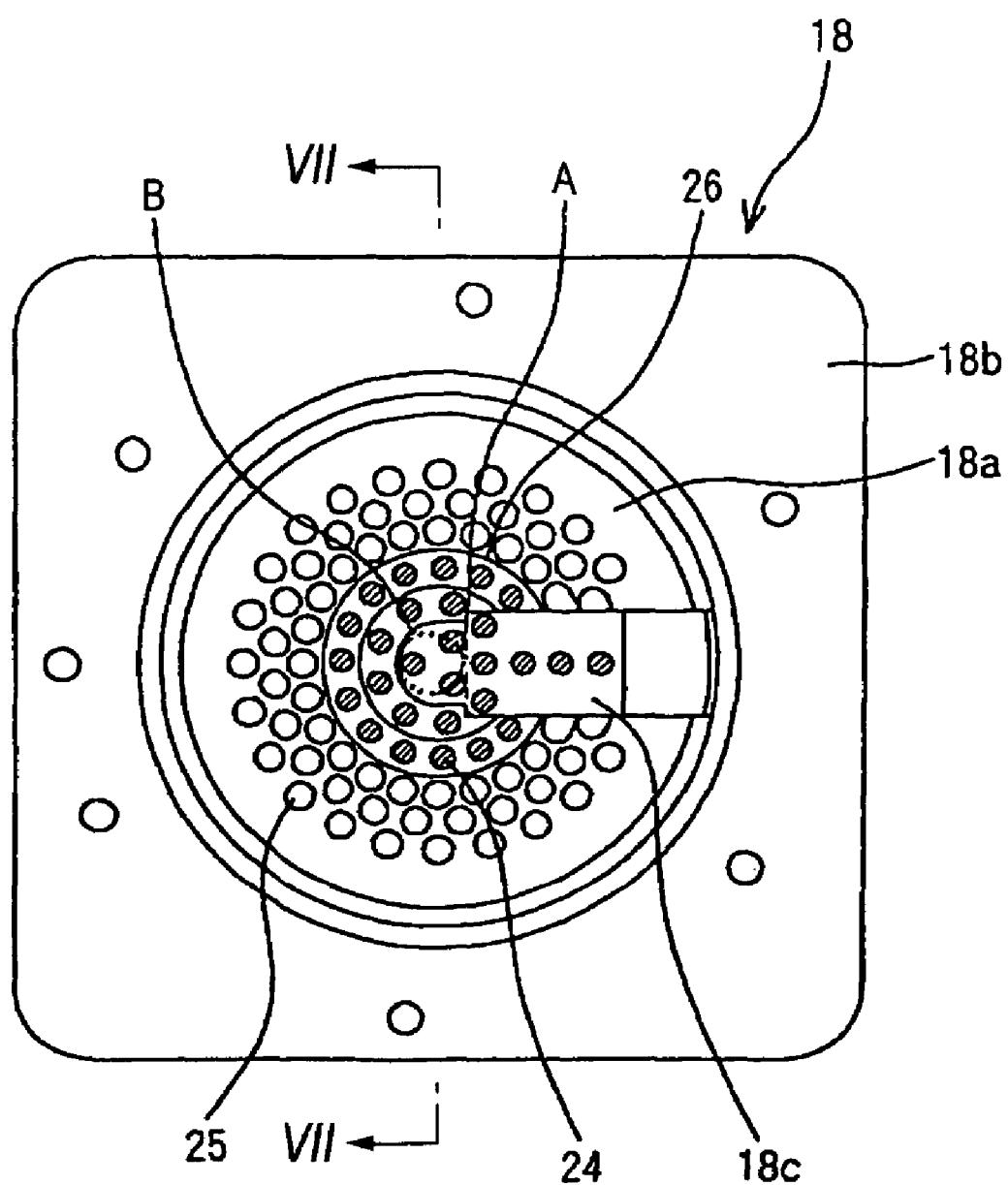
FIG. 6 is a front view of the lower casing of the centrifugal pump according to a second embodiment of the present invention.
Figure 7:
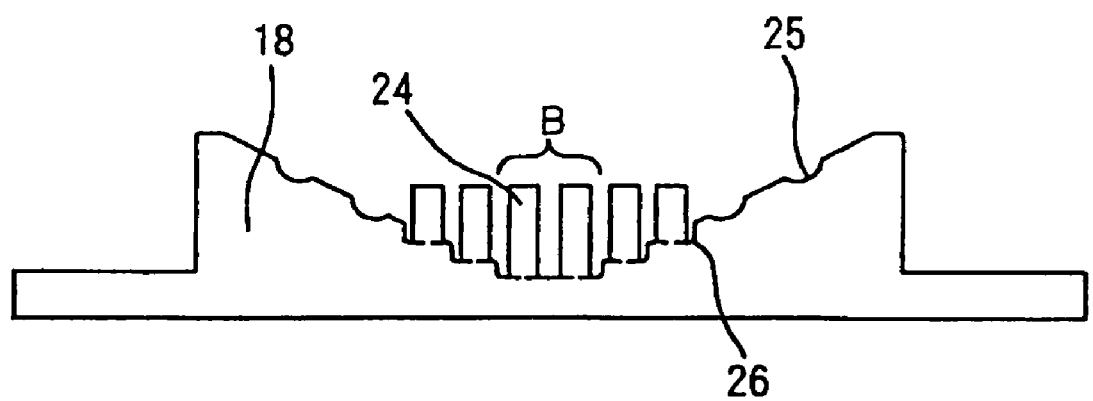
FIG. 7 is a cross-sectional view of the lower casing taken along the line VII-VII in FIG. 6.
Figure 8:
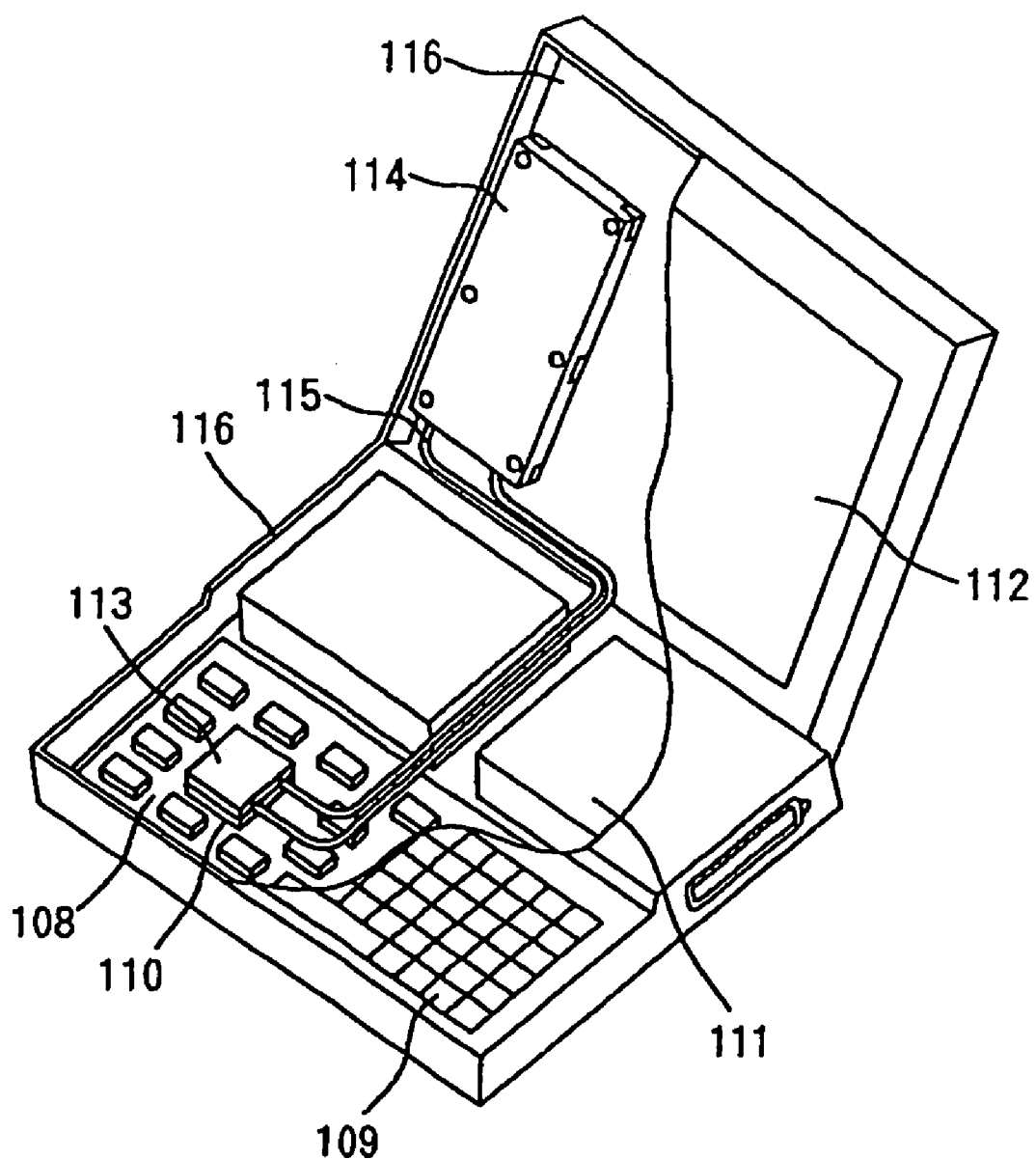
FIG. 8 illustrates the structure of a related cooling device for an electronic apparatus.

A centrifugal pump according to a second embodiment of the present invention will be described. In the centrifugal pump of the second embodiment, the center portion of the recessed portion of a heat-receiving casing is formed with tiny steps. FIG. 6 is a front view of a lower casing of the centrifugal pump according to the second embodiment of the present invention, and FIG. 7 is a cross-sectional view of the lower casing taken along the line VII-VII in FIG. 6. Since the centrifugal pump of the second embodiment has basically the same structure as that of the first embodiment, FIGS. 1 to 3 will be referred. Members having the same reference numeral as those of the first embodiment have basically the same function and property as those in the first embodiment, and the detailed description thereof s will be omitted herein.

In FIGS. 6 and 7, a reference numeral 26 represents a stepped portion that is formed in a recessed conical surface of a conical thick portion 18*a*. A plurality of the stepped portions 26 are provided radially and the height of the stepped portions increases as they are away from the center shaft of an impeller 11, thereby forming the stepped shape. Each stepped portion 26 forms a ring shape and pins 24 protrude from the top of the stepped portions 26. Meanwhile, similar to the first embodiment, dimples 25 are provided outside the stepped portion 26 in the recessed conical surface.

The operation of the centrifugal pump of the second embodiment is basically the same as that of the first embodiment. Refrigerant flows into a suction port 19*a* through a suction passage 19 surrounded by a ring-shaped sealing member and a groove 18*c* of a lower casing 18. The conical thick portion 18*a* is recessed along the outer shape of the impeller 11 toward the suction port 19*a* from a communicating port 17*e*, and a large space exists in the center portion of the suction port 19*a*, so that the refrigerant can flow into the suction port 19*a* against relatively small resistance. In this case, since the second embodiment has the stepped portion 26 provided in the suction port 19*a*, the refrigerant collides with the plurality of pins 24 so as to split, and then collides with a first stepped portion 26 so as to be in a stirred state. Then the refrigerant becomes more turbulent by the pins 24 and the stepped portion 26 at the next stage. Therefore, heat can be exchanged at high efficiency as a whole.

Since the thickness of the center portion of the lower casing 18 is small, the heat from the heat-generating electronic parts 4 is easily transferred, and the pins are concentrated in the center portion of the lower casing, the area of heat transfer to the refrigerant can be increased. With the above structure, the thermal conduction of the lower casing 18 is large, and the pins 24 and the stepped portion 26 easily form a turbulent boundary layer, and the area of heat transfer is also large. Thus, the synergy effect can make the center portion of the lower casing 18 receive heat at high efficiency.

The present invention can be applied to the cooling device for electronic parts, which cools the heat-generating electronic parts by the circulation of the refrigerant.

What is claimed is:

1. A cooling device comprising:
a heat-radiating device and a centrifugal pump provided in a closed circulation passage for circulating refrigerant,
wherein the centrifugal pump contacts heat-generating electronic parts to absorb heat from the heat-generating electronic parts by the heat exchange of the refrigerant therein to radiate the heat via the heat-radiating device,
wherein the centrifugal pump includes:
a lower casing that comes into contact with the heat-generating electronic parts;
an upper casing disposed to face the lower casing to form a pump chamber; and
an impeller sandwiched between the upper casing and the lower casing,
wherein the lower casing includes a recessed conical surface facing the impeller, a plurality of protrusions provided in a center portion of the recessed conical surface and a contact face with which the heat-generating electronic parts come into contact formed directly below the protrusions on an opposite side of the recessed conical surface, and
wherein at least one of the protrusions supports a bearing of the impeller.

2. The cooling device according to claim 1, wherein a protrusion located at an outermost position among the protrusions faces inner circumferential edges of blades of the impeller with a certain gap therebetween.

3. The cooling device according to claim 1, wherein the recessed conical surface of the center portion from which the protrusions protrude and a portion of the recessed conical surface around the center portion form a conical surface having substantially the same slope angle.

4. A cooling device comprising:
a heat-radiating device and a centrifugal pump provided in a closed circulation passage for circulating refrigerant,
wherein the centrifugal pump comes into contact with heat-generating electronic parts to absorb heat from the heat-generating electronic parts by the heat exchange of the refrigerant to radiate the heat via the heat-radiating device,
wherein the centrifugal pump includes:
a first casing having a heat-receiving surface that comes into contact with the heat-generating electronic parts and receives heat;
a second casing fitted with the first casing and sandwiches an impeller between the first casing and the second casing; and
a sealing member sandwiched between the first casing and the second casing to form a pump chamber, and
wherein a recessed conical surface is formed on the side of the first casing facing the impeller.

5. The cooling device according to claim 4, wherein the first casing is made of metal, and wherein the second casing and the sealing member are made of resin.

6. The cooling device according to claim 4, wherein a groove is formed in the recessed conical surface of the first casing, and wherein the sealing member has a water passage sealing member that covers the groove.

7. A cooling device comprising:
a heat-radiating device and a centrifugal pump provided in a closed circulation passage for circulating refrigerant,
wherein the centrifugal pump contacts heat-generating electronic parts to absorb heat from the heat-generating electronic parts by the heat exchange of the refrigerant therein to radiate the heat via the heat-radiating device,
wherein the centrifugal pump includes:
a lower casing that comes into contact with the heat-generating electronic parts;

an upper casing disposed to face the lower casing to form a pump chamber; and an impeller sandwiched between the upper casing and the lower casing, and wherein the lower casing includes a recessed conical surface facing the impeller, a plurality of protrusions provided in a center portion of the recessed conical surface are formed so as to protrude toward the impeller with heights of the protrusions decreasing radially outward, and a contact face with which the heat-generating electronic parts come into contact formed directly below the protrusion on an opposite side of the recessed conical surface.

* * * * *

UNITED STATES PATENT AND TRADEMARK OFFICE
CERTIFICATE OF CORRECTION

| | |
|---|---|
| PATENT NO. | : 7,255,154 B2 |
| APPLICATION NO. | : 11/126323 |
| DATED | : August 14, 2007 |
| INVENTOR(S) | : Shinya Koga et al. |

It is certified that error appears in the above-identified patent and that said Letters Patent is hereby corrected as shown below:

On the Title Page Item (30) which reads "Foreign Application Priority Data December 5, 2004 (JP) ................2004-142032," should read --Foreign Application Priority Data May 12, 2004 (JP)................2004-142032--

Signed and Sealed this

Twenty-ninth Day of July, 2008

JON W. DUDAS
*Director of the United States Patent and Trademark Office*